United States Patent [19]

Taka et al.

[11] Patent Number: 4,871,685
[45] Date of Patent: Oct. 3, 1989

[54] METHOD OF MANUFACTURING BIPOLAR TRANSISTOR WITH SELF-ALIGNED EXTERNAL BASE AND EMITTER REGIONS

[75] Inventors: Shin-ichi Taka, Yokosuka; Jiro Ohshima, Kawasaki, both of Japan

[73] Assignee: Kabushiki Kaisha Toshiba, Kawasaki, Japan

[21] Appl. No.: 230,823

[22] Filed: Aug. 11, 1988

[30] Foreign Application Priority Data

Aug. 13, 1987 [JP] Japan .................................. 62-202384

[51] Int. Cl.$^4$ ........................................... H01L 21/265
[52] U.S. Cl. ........................................ 437/33; 437/31; 437/192; 437/228; 148/DIG. 10; 148/DIG. 11; 357/34
[58] Field of Search .................... 437/31, 32, 33, 192, 437/245, 225, 238, 239, 228, 69; 148/DIG. 10, DIG. 11, DIG. 117; 357/34; 156/653, 657, 643

[56] References Cited

U.S. PATENT DOCUMENTS

| | | | |
|---|---|---|---|
| 4,486,946 | 12/1984 | Jopke | 437/177 |
| 4,728,618 | 3/1988 | Hirao | 357/34 |
| 4,764,482 | 8/1988 | Hsu | 437/31 |
| 4,778,774 | 10/1988 | Blossfeld | 357/43 |

*Primary Examiner*—Brian E. Hearn
*Assistant Examiner*—Kevin McAndrews
*Attorney, Agent, or Firm*—Finnegan, Henderson, Farabow, Garrett & Dunner

[57] ABSTRACT

A metal layer is formed by selective CVD method on an emitter region formed by using a field oxide film as a mask. Opening for ion-implanting an impurity for forming external base region is formed in the field oxide film by utilizing the metal layer and a metal layer creep up a bird's beak of the field oxide film as masks. An impurity is doped in a semiconductor substrate through the opening formed in the field oxide film to form external base region. The distance between the emitter region and external base region is controlled by a length of the metal layer creep up the bird's beak.

14 Claims, 5 Drawing Sheets

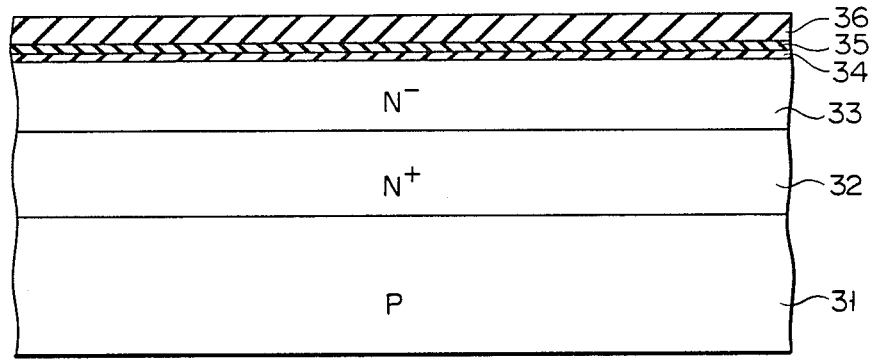
F I G. 1A
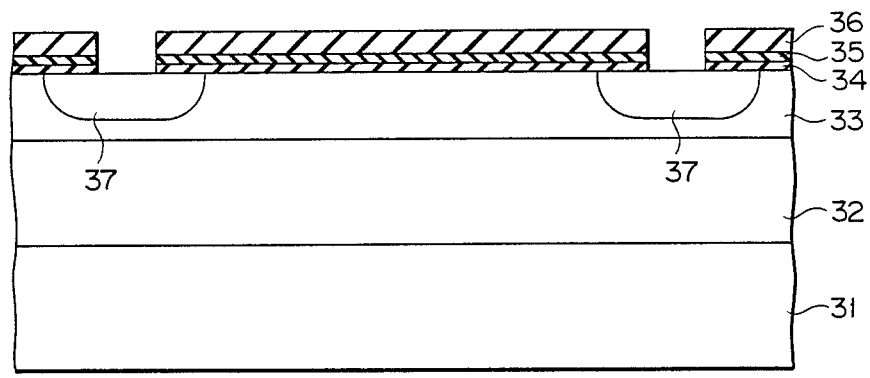
F I G. 1B
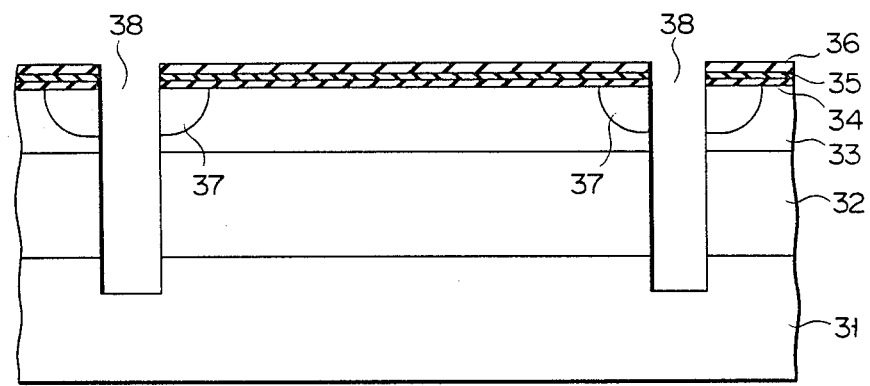
F I G. 1C

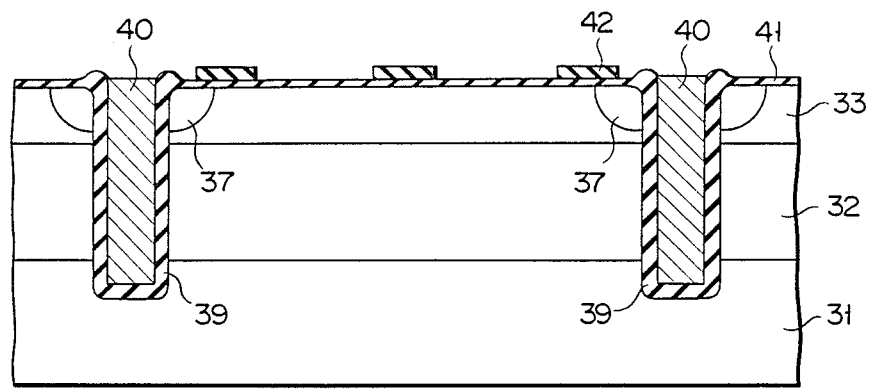
F I G. 1G
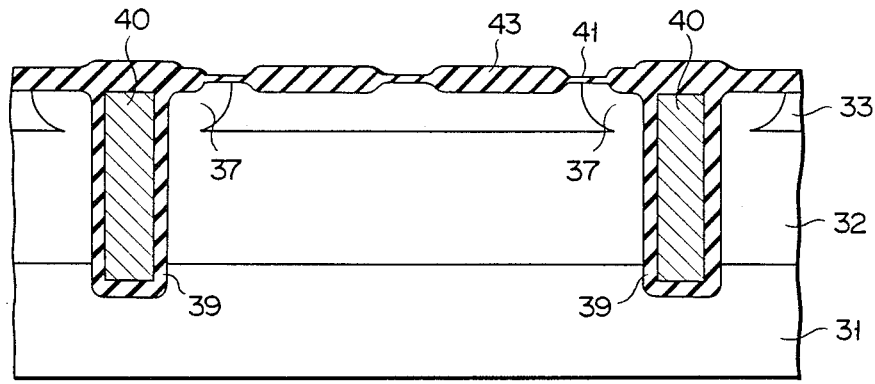
F I G. 1H
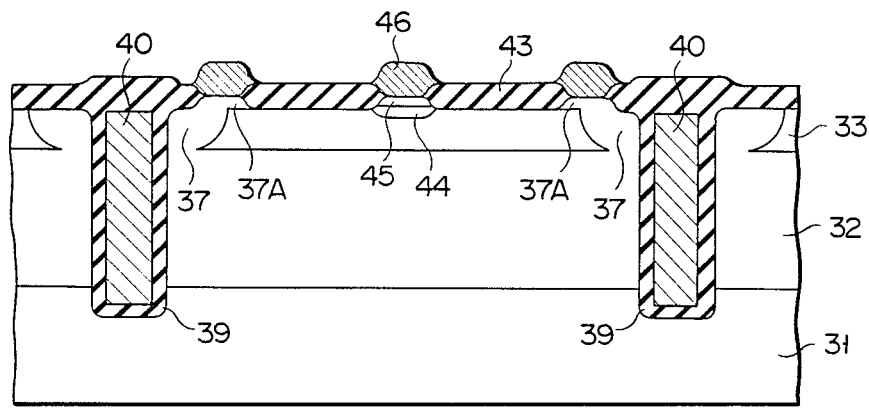
F I G. 1I

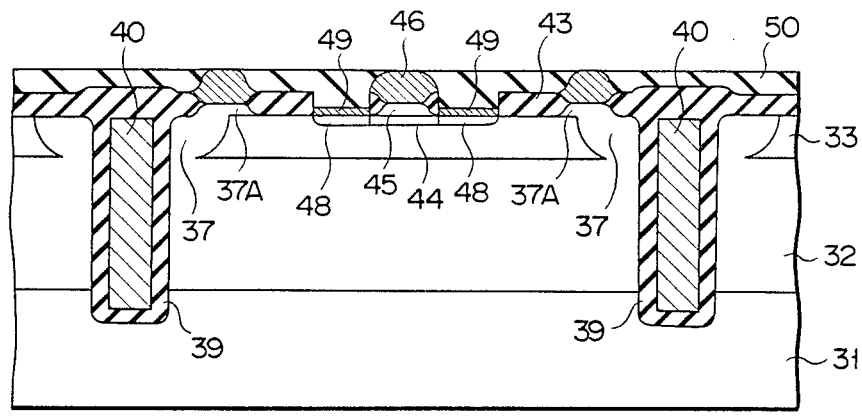
F I G. 1M
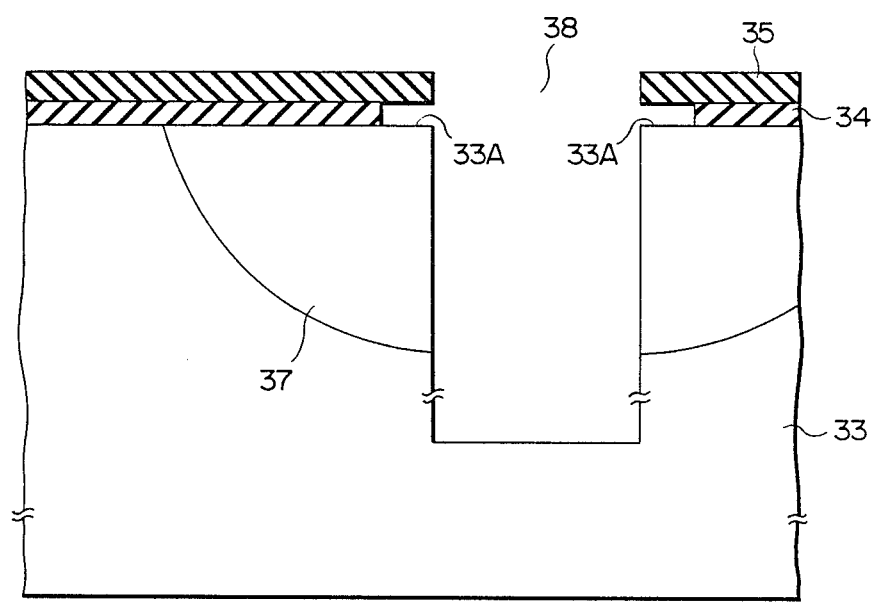
F I G. 2

METHOD OF MANUFACTURING BIPOLAR TRANSISTOR WITH SELF-ALIGNED EXTERNAL BASE AND EMITTER REGIONS

BACKGROUND OF THE INVENTION

1. Field of the Invention

The present invention relates to a method of manufacturing a high-speed bipolar transistor, high-speed bipolar LSI or the like and, more particularly, to a method of manufacturing a bipolar transistor with self-aligned external base and emitter regions.

2. Description of the Related Art

An SST-1A process developed by NTT (Nihon Telephone and Telegram Inc.) is known as a conventional method of manufacturing a bipolar transistor wherein an external base region and an emitter region are self-aligned. This process is described in IEDM-INTERNATIONAL ELECTRON DEVICES MEETING 1983, pp. 16, T. Sakai and M. Suzuki. According to the SST-1A process, the emitter region and the external base region can be formed in self-alignment. According to this method, however, four polysilicon deposition steps are required. In addition, a large number of difficult steps such as etch-back are required. For these reasons, it is difficult to stably manufacture uniform bipolar transistors. Therefore, manufacturing cost of the bipolar transistor is undesirably increased.

In the method of manufacturing the bipolar transistor described above, the emitter region and the external base region cannot be easily self-aligned with high precision and good controllability.

SUMMARY OF THE INVENTION

It is, therefore, an object of the present invention to provide a method of manufacturing a bipolar transistor wherein an emitter region and an external base region can be easily self-aligned with high precision and good controllability.

According to an aspect of the present invention, there is provided a method of manufacturing a bipolar transistor, comprising the steps of: forming a buried layer of a second conductivity type in a major surface of a semiconductor substrate of a first conductivity type; forming an epitaxial layer of the second conductivity type on the buried layer, the epitaxial layer having an impurity concentration lower than that of the buried layer; selectively forming a field oxide film on the epitaxial layer except for prospective emitter and base regions; doping an impurity of the first conductivity type in the epitaxial layer by using the field oxide film as a mask, thereby forming a base region; doping an impurity of the second conductivity type in the base region by using the field oxide film as a mask, thereby forming an emitter region; forming a metal layer on the emitter region and a bird's beak of the field oxide film by selective CVD method; selectively removing the field oxide film using the metal layer as part of a mask to expose a surface portion of the epitaxial layer at the prospective external base region; and doping an impurity in the epitaxial layer by using the metal layer and the field oxide film as masks to form an external base region of the first conductivity type.

According to the method described above, the metal layer is formed on the emitter region by using the field oxide film as a mask according to CVD method, and opening for doping an impurity to form the external base region is formed in the field oxide film by utilizing a field oxide film creep up the bird's beak of the metal layer. The distance between the emitter region and the external base region is controlled by the CVD metal layer extending around the emitter region. Therefore, the emitter region and the external base region of the bipolar transistor can be formed in self-alignment. According to this method, the number of polysilicon deposition steps and the number of processing steps (e.g., etch-back) which are difficult to be controlled can be reduced. Therefore, a bipolar transistor can be easily manufactured with high precision and good controllability.

BRIEF DESCRIPTION OF THE DRAWINGS

FIGS. 1A to 1M are sectional views for explaining the steps in manufacturing a bipolar transistor according to an embodiment of the present invention; and FIG. 2 is an enlarged view showing part of the section in FIG. 1D.

DETAILED DESCRIPTION OF THE PREFERRED EMBODIMENTS

Figure 1D:
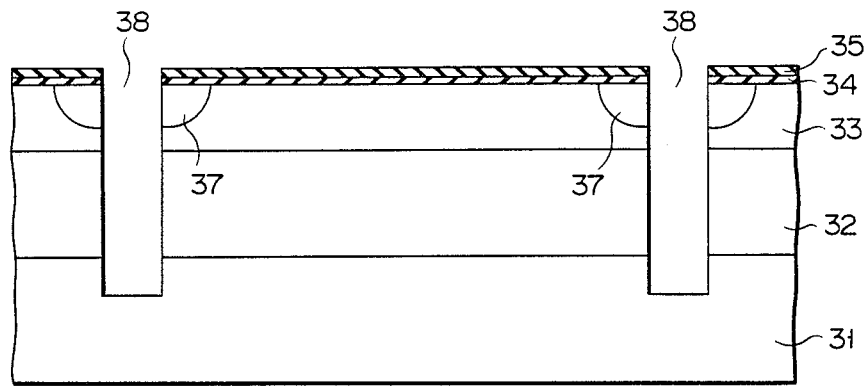

FIGS. 1A to 1M show sequential steps of manufacturing a bipolar transistor according to an embodiment of the present invention. As shown in FIG. 1A, n+-type buried layer 32 is formed on the entire surface of ptype silicon substrate 31. 1.5 $\mu$m thick n--type epitaxial layer 33 is deposited on buried layer 32. The surface of epitaxial layer 33 is then oxidized in an $H_2/O_2$ atmosphere at 900° C. to form 500 Å thick thermal oxide film 34. 1,000 Å thick $Si_3N_4$ film 35 is formed on thermal oxide film 34 by LPCVD (Low-Pressure Chemical Vapor Deposition) method. 5,000 Å thick $SiO_2$ film 36 is formed on $Si_3N_4$ film 35 by CVD (Chemical Vapor Deposition) method.

CVD-$SiO_2$ film 36, $Si_3N_4$ film 35, and thermal oxide film 34 in the region subjected to trench isolation are selectively removed using photolithographic techniques known to those skilled in the art. Phosphorus ions are doped using $POCl_3$ and remaining CVD-$SiO_2$ film 36, $Si_3N_4$ film 35, and thermal oxide film 34 as masks. Therefore, deep n+-type impurity region 37 is formed in epitaxial layer 33, as shown in FIG. 1B.

As shown in FIG. 1C, isolation trench 38 is formed by RIE (Reactive Ion Etching) method. The depth of trench 38 is sufficiently larger than the thickness of buried layer 32.

As shown in FIG. 1D, remaining CVD-$SiO_2$ film 36 is removed by using $NH_4F$.

Figure 1E:
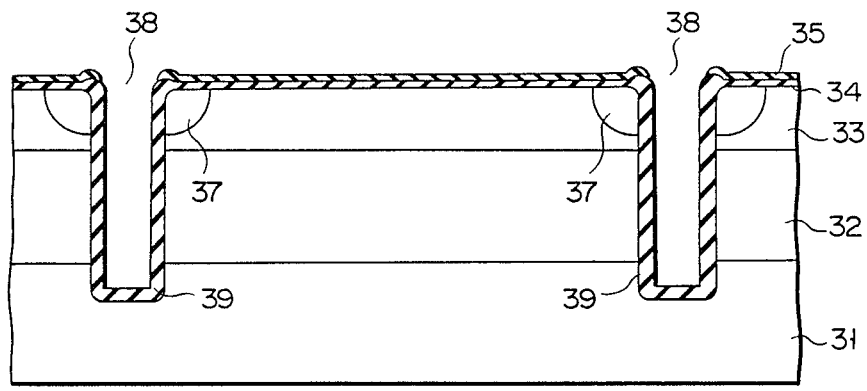
Figure 1F:
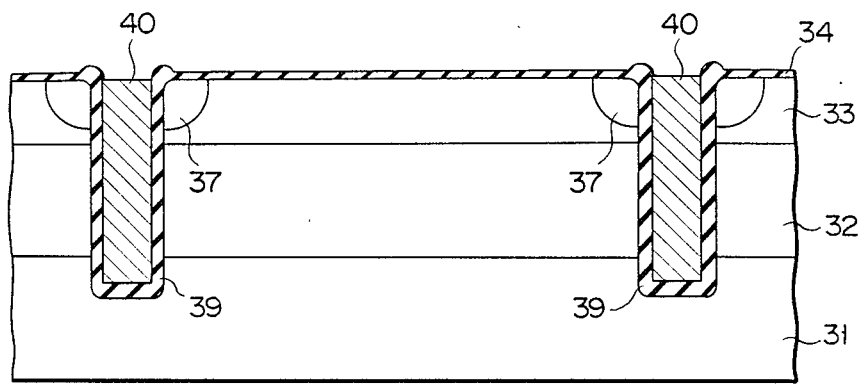

As shown in FIG. 1E, selective oxidation (the substrate surface portion exposed in trench 38 is performed by using exposed $Si_3N_4$ film 35 as a mask. Thermal oxide film 39 is formed on the side surfaces and the bottom of trench 38, respectively. Boron ions are implanted in the bottom of trench 38 to prevent current leakage between the element regions isolated by the trench.

Polysilicon layer 40 is deposited on the entire surface of the resultant structure, so that trench 38 is filled with polysilicon layer 40. Polysilicon layer 40 is etched back to leave only polysilicon portion 40 in trench 38. Thereafter, $Si_3N_4$ film 35 is removed to obtain a structure shown in FIG. 1F.

In the next step, thermal oxide film 34 formed on the surface of epitaxial layer 33 is removed, and thermal oxidation is performed again to form 200 Å thick thermal oxide film 41. $Si_3N_4$ film 42 is formed on the entire surface of thermal oxide film 41 and is patterned to form a selective oxidation mask for LOCOS method (FIG.

1G). The surface of the substrate is selectively oxidized to form 4,000 Å thick field oxide film 43 by using $Si_3N_4$ 42 as a mask, and $Si_3N_4$ film 42 is removed (FIG. 1H).

Boron ions are implanted in only the element formation region by using a photoresist block, and p-type impurity region (base region) 44 is formed in the surface region of $n^-$-type epitaxial layer 33. After the photoresist block is removed, arsenic ions are implanted in the collector connecting region and the prospective emitter region by using field oxide film 43 as a mask, thereby forming $n^+$-type impurity region 37A for the collector connecting, and emitter region 45. The resultant structure is annealed in an $N_2$ atmosphere at 950° C. for 15 minutes, thereby activating base and emitter regions 44 and 45. Buffer oxide film 41 is removed from the surface of the substrate, and tungsten layer 46 is deposited on the exposed surface of the substrate according to selective CVD method. A reaction gas for the above selective CVD contains $WF_6$. When $SiF_4$ is added to the reaction gas, the reaction rate can be increased. However, if the content of $SiF_4$ is excessive, a tungsten layer is undesirably formed on the entire surface of field oxide film 43 in addition to the bird's beak. Therefore, the content of $SiF_4$ must be controlled to be a proper value enough to allow formation of tungsten layer 46 on only the bird's beak. The thickness of tungsten layer 46 is set to be about 6,000 Å. In this case, 3,000 Å thick tungsten layer 46 is crept up the bird's beak of field oxide film 43 (FIG. 1I).

Figure 1J:
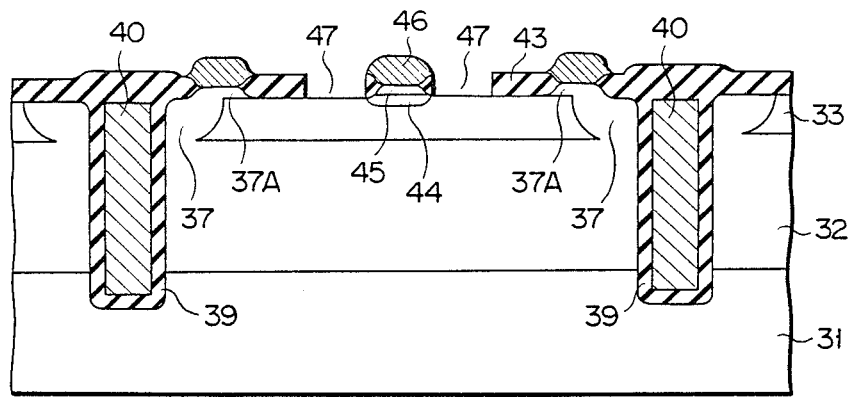

As shown in FIG. 1J, selective etching is performed to remove field oxide film 43 from the prospective external base region, and opening 47 is formed. A resist pattern with window including emitter region 45 is used to form opening 47. When $SiO_2$ film (field oxide film) 43 is removed by RIE method, tungsten layer 46 serves as a mask. For this reason, external base region formation opening 47 is self-aligned with emitter region 45. The distance between emitter region 45 and external base region is determined by a creep up length of tungsten layer 46 on field oxide film 43.

Figure 1K:
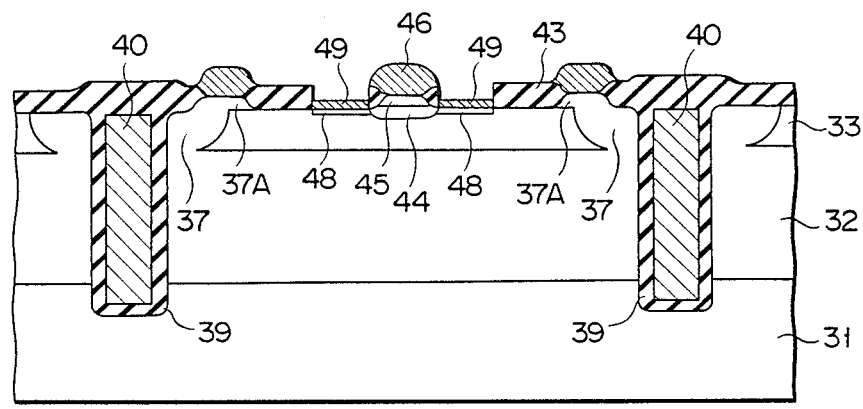

As shown in FIG. 1K, $BF_2^+$ ions are doped by using field oxide film 43 and tungsten layer 46 as masks, thus doping the impurity for the external base region. 500 Å thick tungsten layer 49 is formed on external base region 48 by selective CVD method, respectively, thereby reducing the contact resistance between external base region 48 and a base electrode to be described later.

Figure 1L:
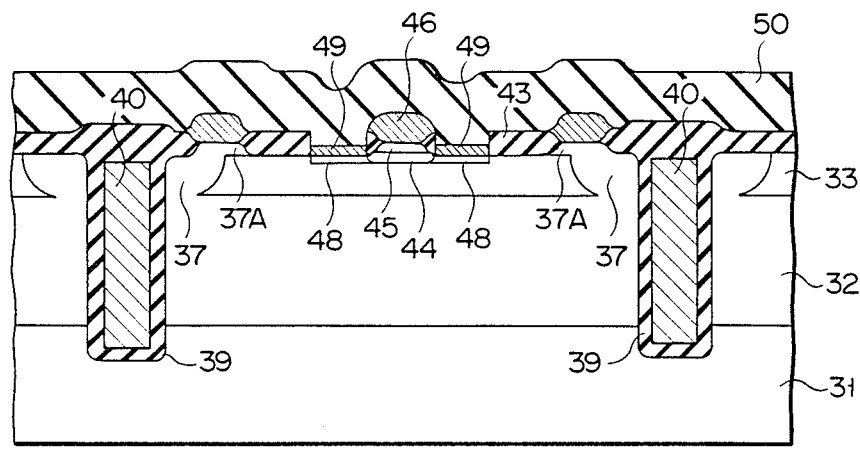

Subsequently, as shown in FIG. 1L, 8,000 Å thick $CVD\text{-}SiO_2$ film 50 is deposited on the entire surface of the resultant structure and is annealed at a low temperature of 550° C. for 120 minutes, and therefore external base region 48 is activated.

As shown in FIG. 1M, $CVD\text{-}SiO_2$ film 50 is etched back. An opening is formed in portion of $CVD\text{-}SiO_2$ film 50 above tungsten layer 49. Collector, base and emitter electrodes (not shown) are formed by a method known to those skilled in the art, thereby preparing a bipolar transistor.

According to the method described above, the number of steps can be greatly reduced as compared with the SST-1A process. In addition, the number of polysilicon deposition steps and etch-back steps which are difficult to be controlled can be reduced, as compared with the SST-1A process. Therefore, fluctuation factors caused by variations in manufacturing process can be greatly reduced. A micropatterned bipolar transistor having a distance of 0.1 to 0.4 μm between external base region 48 and emitter region 45 can be stably manufactured. The decrease in manufacturing steps allows reduction in manufacturing cost.

After $n^+$-type region 37 is formed, trench 38 is formed by RIE method using an isolation trench mask. Parts of the $n^+$-type region can be included in the isolation region, and region 37 and trench 38 can be formed in self-alignment. A mask alignment error for $n^+$-type region 37 and trench 38 need not be taken into consideration. High precision of the manufacturing process can be assured, and the process can be simplified. In addition, the corner portions of the upper ends of trench 38 have a high impurity concentration and are quickly oxidized. In the step of FIG. 1D, in order to remove $CVD\text{-}SiO_2$ film 36, the portions of thermal oxide film 34 facing trench 38 is laterally etched to expose parts 33A of the surface of epitaxial layer 33, as shown in the enlarged view of FIG. 2. As shown in FIG. 1E, the corner portions of the opening of trench 38 are automatically etched and rounded without performing an additional step. Concentration of a stress on the corner portions of trench 38 during the subsequent oxidation of the polysilicon layer can be suppressed. Therefore, formation of defect around the trench can be prevented without complicating the manufacturing process or increasing the cost.

According to the present invention as has been described above, there is provided a method of manufacturing a bipolar transistor wherein the emitter and external base region can be easily self-aligned with high precision and good controllability.

What is claimed is:

1. A method of manufacturing a bipolar transistor wherein an external base region and an emitter region are formed in self-alignment, comprising steps of:
    forming a buried layer of a second conductivity type in a major surface of a semiconductor substrate of a first conductivity type;
    forming an epitaxial layer of the second conductivity type on said buried layer, said epitaxial layer having an impurity concentration lower than that of said buried layer;
    selectively forming a field oxide film on said epitaxial layer except for prospective emitter and base regions;
    doping an impurity of the first conductivity type in said epitaxial layer by using said field oxide film as a mask, thereby forming a base region;
    doping an impurity of the second conductivity type in said base region by using said field oxide film as a mask, thereby forming an emitter region;
    forming a metal layer on said emitter region and a bird's beak of said field oxide film by selective CVD method;
    selectively removing said field oxide film using said metal layer as part of a mask to expose a surface portion of said epitaxial layer at a prospective external base region; and
    doping an impurity in said epitaxial layer by using said metal layer and said field oxide film as masks to form external base region of the first conductivity type.

2. A method according to claim 1, further comprising a step of forming a trench isolation region after said step of forming said epitaxial layer.

3. A method according to claim 2, wherein said step of forming the trench isolation region includes: steps of thermally oxidizing a surface of said epitaxial layer to form a first thermal oxide film; forming a first oxidation resistant film on said first thermal oxide film; forming an oxide film on said first oxidation resistant film; patterning said first thermal oxide film, said first oxidation resistant film, and said oxide film with an identical pattern to form a window in a prospective trench formation region; doping an impurity in said semiconductor substrate by using said first thermal oxide film, said first oxidation resistant film, and said oxide film as masks to form an impurity region of the second conductivity type; performing anisotropic etching of said first thermal oxide film, said first oxidation resistant film, and said oxide film as masks to form a trench in said semiconductor substrate, said trench having a depth larger than a thickness of said buried layer; removing the remaining first oxide film to expose a surface of said first oxidation resistant film; selectively oxidizing said semiconductor substrate by using the exposed first oxidation resistant film so as to form a second thermal oxide film on a side wall and a bottom of said trench; doping an impurity of the first conductivity type in the bottom of said trench; depositing a polysilicon layer on an entire surface of a resultant structure; etching back said polysilicon layer to leave the polysilicon layer in only said trench; removing said first thermal oxide film formed on the surface of said epitaxial layer to expose the surface of said epitaxial layer; thermally oxidizing the exposed surface of said epitaxial layer to form a third thermal oxide film; and forming a second oxidation resistant film on said third thermal oxide film and patterning said second oxidation resistant film, the step of forming said field oxide film being performed by using said second oxidation resistant film as the mask.

4. A method according to claim 3, wherein said first, second, and third thermal oxide films include a silicon oxide film.

5. A method according to claim 3, wherein said first and second oxidation resistant film include a silicon nitride film.

6. A method according to claim 3, wherein said oxide film includes a silicon oxide film formed by CVD method.

7. A method according to claim 3, wherein said anisotropic etching includes RIE.

8. A method according to claim 1, wherein said metal layer contains tungsten.

9. A method according to claim 1, wherein said field oxide film is formed by LOCOS method.

10. A method according to claim 1, further comprising a step of forming a second metal layer on said external base region according to selective CVD method after the step of forming said external base region is completed.

11. A method according to claim 10, wherein said second metal layer contains tungsten.

12. A method according to claim 1, further including steps of forming a second metal layer on said external base region according to selective CVD method; forming an insulating film on an entire surface of a resultant structure, and performing low-temperature annealing to achieve said external base region after said step of forming said external base regions is completed.

13. A method according to claim 12, wherein said second metal layer contains tungsten.

14. A method according to claim 12, wherein said insulating film includes a silicon oxide film formed by CVD method.

* * * * *